United States Patent
Humfeld et al.

(10) Patent No.: US 11,371,135 B2
(45) Date of Patent: Jun. 28, 2022

(54) SYSTEM AND PROCESS FOR CHEMICAL VAPOR DEPOSITION

(71) Applicant: The Boeing Company, Chicago, IL (US)

(72) Inventors: Keith Daniel Humfeld, Federal Way, WA (US); De'Andre James Cherry, Ladson, SC (US)

(73) Assignee: THE BOEING COMPANY, Chicago, IL (US)

( * ) Notice: Subject to any disclaimer, the term of this patent is extended or adjusted under 35 U.S.C. 154(b) by 100 days.

(21) Appl. No.: 16/434,053

(22) Filed: Jun. 6, 2019

(65) Prior Publication Data
US 2019/0301008 A1 Oct. 3, 2019

Related U.S. Application Data

(62) Division of application No. 15/376,867, filed on Dec. 13, 2016, now Pat. No. 10,337,101.

(51) Int. Cl.
*C23C 16/01* (2006.01)
*C23C 16/26* (2006.01)
(Continued)

(52) U.S. Cl.
CPC ............ *C23C 16/01* (2013.01); *C23C 16/003* (2013.01); *C23C 16/26* (2013.01); *C23C 16/402* (2013.01);
(Continued)

(58) Field of Classification Search
CPC .............. C23C 16/003; C23C 16/4418; C23C 16/4557; C23C 16/01
See application file for complete search history.

(56) References Cited

U.S. PATENT DOCUMENTS

RE37,603 E * 3/2002 Coney .................. F04B 39/062
  60/407
6,984,591 B1  1/2006 Buchanan et al.
(Continued)

OTHER PUBLICATIONS

Water Supply, "Automatic Control System," (Sixth Edition), 2009, an Overview, ScienceDirect, downloaded on Jul. 6, 2021 from https://www.sciencedirect.com/topic/engineering/automatic-control-system, 18 pages.
(Continued)

*Primary Examiner* — Joseph A Miller, Jr.
(74) *Attorney, Agent, or Firm* — MH2 Technology Law Group LLP

(57) ABSTRACT

A chemical vapor deposition method comprises flowing a carrier liquid through a reactor. A fluid comprising one or more reactants is introduced into the carrier liquid. The fluid is at a first temperature and first pressure and is sufficiently immiscible in the carrier liquid so as to form a plurality of microreactors suspended in the carrier liquid. Each of the microreactors comprise a discrete volume of the fluid and have a surface boundary defined by an interface of the fluid with the carrier liquid. The fluid is heated and optionally pressurized to a second temperature and second pressure at which a chemical vapor deposition reaction occurs within the microreactors to form a plurality of chemical vapor deposition products. The plurality of chemical vapor deposition products are separated from the carrier liquid. A system for carrying out the method of the present disclosure is also taught.

20 Claims, 6 Drawing Sheets

(51) Int. Cl.
*C23C 16/00* (2006.01)
*C23C 16/40* (2006.01)
*C23C 16/44* (2006.01)
*C23C 16/455* (2006.01)

(52) U.S. Cl.
CPC ........ *C23C 16/403* (2013.01); *C23C 16/4418* (2013.01); *C23C 16/455* (2013.01); *C23C 16/4557* (2013.01)

(56) References Cited

U.S. PATENT DOCUMENTS

| | | | | |
|---|---|---|---|---|
| 2001/0046792 | A1* | 11/2001 | Takahashi | H01L 21/0214 438/786 |
| 2003/0009067 | A1* | 1/2003 | Bouziane | C10B 47/30 422/600 |
| 2004/0043218 | A1* | 3/2004 | Johnson | G02B 1/105 428/408 |
| 2004/0238005 | A1* | 12/2004 | Takayama | H01L 21/67051 134/18 |
| 2004/0250775 | A1* | 12/2004 | Sakai | C23C 16/4412 118/728 |
| 2006/0165910 | A1 | 7/2006 | Kodas et al. | |
| 2011/0061289 | A1* | 3/2011 | Mann | C11C 3/10 422/224 |

OTHER PUBLICATIONS

Smith, "Temperature Control Basics," Plant Engineering Magazine Sep. 15, 2002, downloaded on Jul. 6, 2021 from https://plantengineering.com/articles/temperature-control-basics/, 10 pages.

Garrett-Dyke, "What Is a Temperature Control System?," West Control Solutions, posted on Mar. 13, 2014, downloaded from https://www.west-cs.com/news/what-is-a-temperature-control-system/, 3 pages.

* cited by examiner

SYSTEM AND PROCESS FOR CHEMICAL VAPOR DEPOSITION

This application is a divisional of U.S. patent application Ser. No. 15/376,867, filed on Dec. 13, 2016, issued as U.S. Pat. No. 10,337,101 on Jul. 2, 2019, the disclosure of which is incorporated by reference herein in its entirety.

DETAILED DESCRIPTION

Field of the Disclosure

The present disclosure is directed to a system and process for chemical vapor deposition, and in particular a process employing microreactors to form products by chemical vapor deposition.

Background

Chemical vapor deposition ("CVD") is well known in industry today for fabricating a variety of products. Examples of such products include thin films used in solid state devices, carbon nanotubes and passivation coatings for various products. Traditional CVD growths are batch-based processes, which can be costly for mass production. Further, there can be significant spatial variation in CVD growth due to the limitations of batch CVD reactors. For example, carbon nanotubes ("CNTs") grown in batch CVD processes exhibit non-uniformity in CNT characteristics, such as the distribution of length of the CNT for a given chirality. This lack of uniformity can be undesirable for some product applications.

In addition, certain products can be difficult to manufacture using traditional chemical vapor deposition techniques. For example, growing thin spherical shells today often requires a small spherical substrate, with the shells being grown outside the substrate. Such substrates are generally if not always solids and can dominate the weight of the final product. There are few if any CVD methods today for mass producing hollow spherical shells of most materials, where a complete shell is grown as a single spherical layer. Instead, other non-CVD techniques are employed. For example, glass spheres have been fabricated by ultrasonic spray pyrolysis, or by heating the sealed end of a glass tube and blowing air through the opposite open end. However, such methods are generally performed using batch processing techniques, and can be difficult, costly and/or inefficient for mass producing hollow glass spheres.

Thus, there is a need in the art for a novel CVD process that can provide advantages over traditional batch processing CVD techniques.

SUMMARY

The present disclosure is directed to a chemical vapor deposition method. The method comprising flowing a carrier liquid through a reactor. A fluid comprising one or more reactants is introduced into the carrier liquid. The fluid is at a first temperature and first pressure and is sufficiently immiscible in the carrier liquid so as to form a plurality of microreactors suspended in the carrier liquid. Each of the microreactors comprise a discrete volume of the fluid and have a surface boundary defined by an interface of the fluid with the carrier liquid. The fluid is heated and optionally pressurized to a second temperature and second pressure at which a chemical vapor deposition reaction occurs within the microreactors to form a plurality of chemical vapor deposition products. The plurality of chemical vapor deposition products are separated from the carrier liquid.

The present disclosure is also directed to a microreactor system. The microreactor system comprises a reservoir for holding a carrier liquid. A reactor conduit is in fluid communication with the reservoir. An injector is in fluid communication with a reactant supply, the injector being positioned so as to inject a fluid comprising reactants from the reactant supply into the reactor conduit. A temperature control system is positioned to actively heat or cool the injector. A product separation system is in fluid communication with the reactor conduit, the product separation system being configured to collect a product from the carrier liquid. A carrier liquid return system is in fluid communication with both the separation system and the reservoir for holding the carrier liquid. The carrier liquid return system comprises a pump and a return conduit configured for returning the carrier liquid from the separation system to the reservoir.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate aspects of the present teachings and together with the description, serve to explain the principles of the present disclosure.

Figure 1:
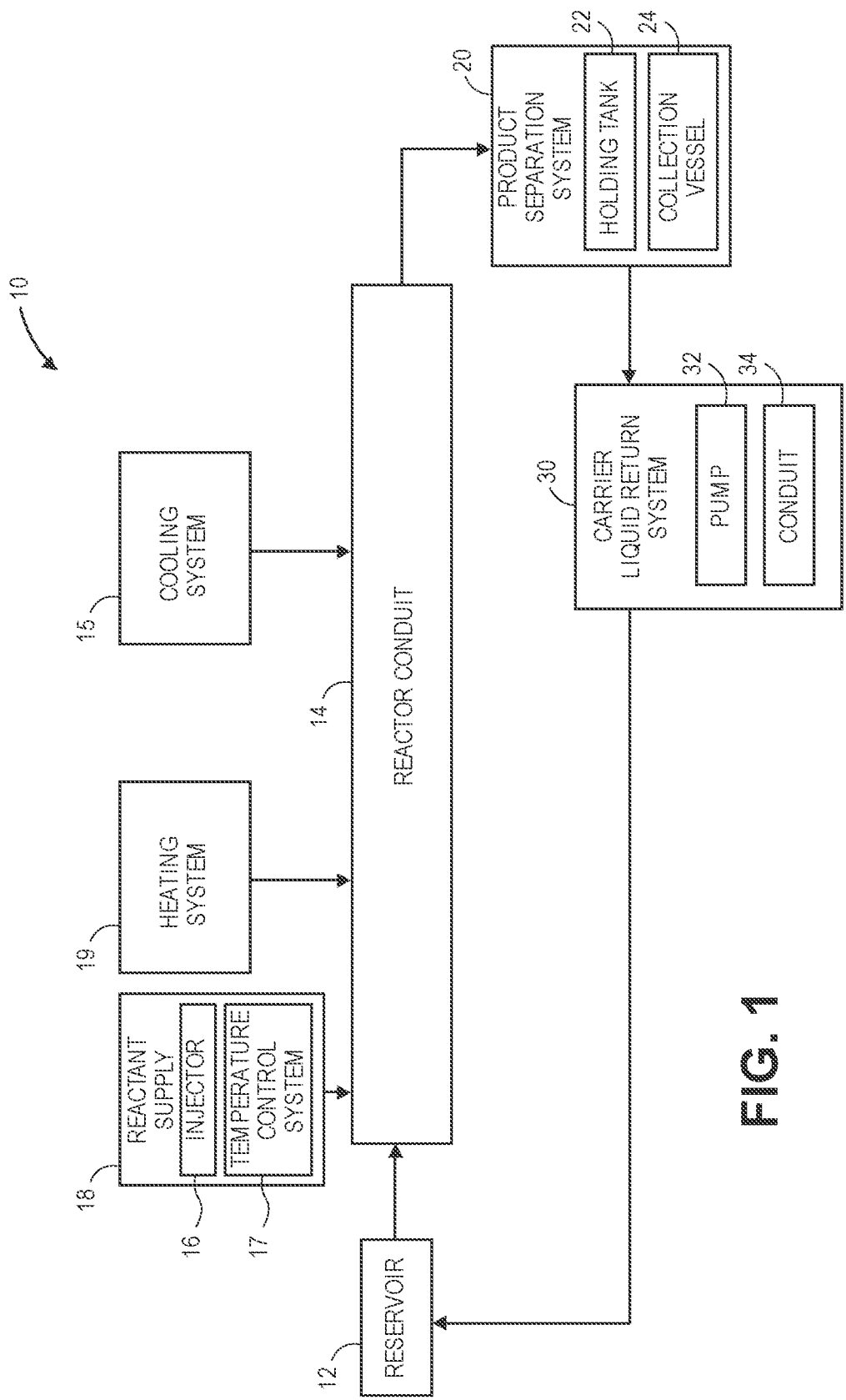
FIG. 1 is a functional block diagram of a microreactor system for chemical vapor deposition, according to an aspect of the present disclosure.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

Thus, there is a need for a CVD process that can provide one or more advantages, such as, for example, the ability to produce relatively uniform products, the ability to fabricate products using continuous processing methods, and/or the ability to mass produce products that are otherwise difficult to form by traditional batch processing CVD techniques.

Figure 2:
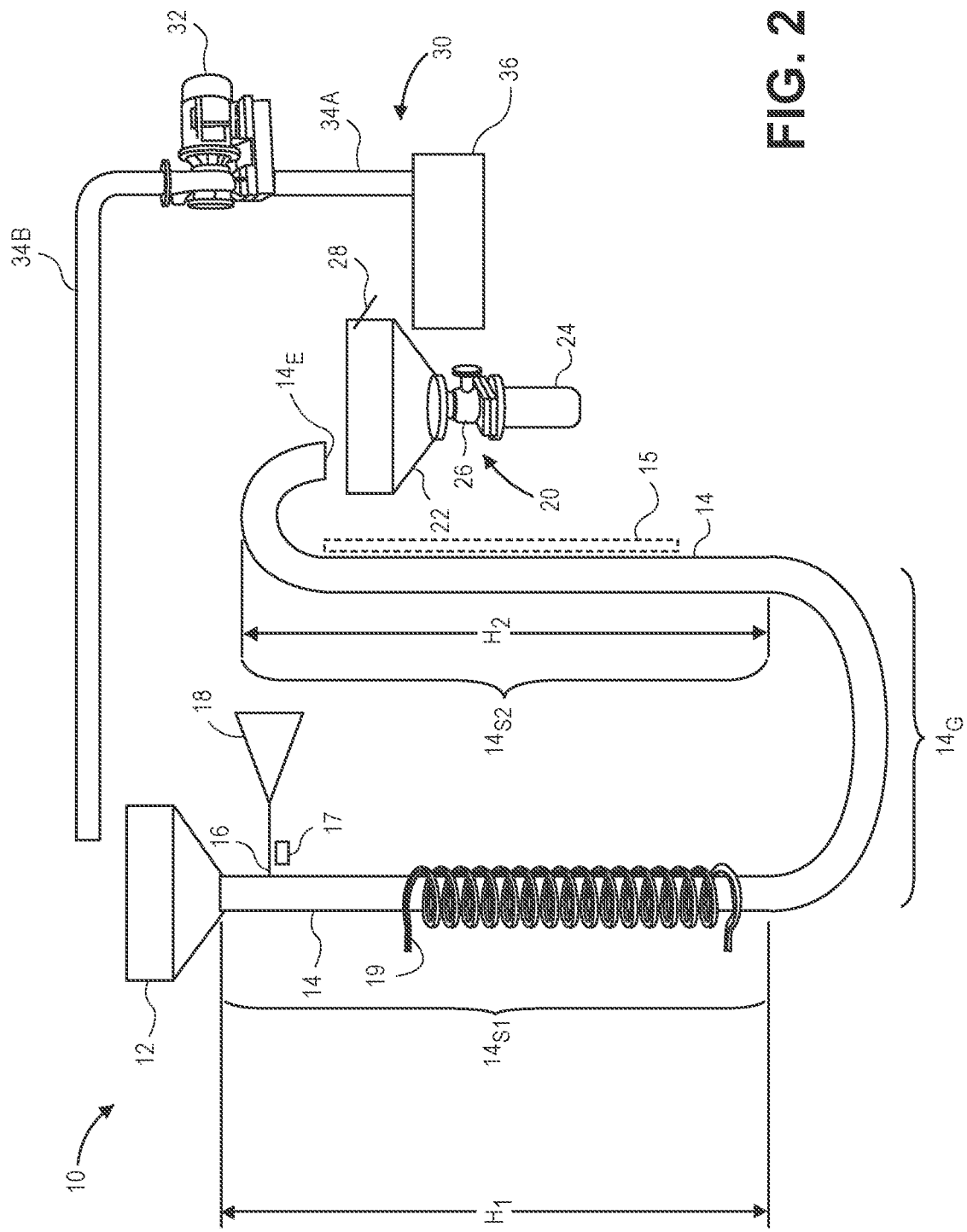
FIG. 2 illustrates a schematic view of an example microreactor system for chemical vapor deposition, according to an aspect of the present disclosure.

The present disclosure is directed to a method and system of employing microreactors for chemical vapor deposition. A functional block diagram of a microreactor system 10 that can be employed for carrying out the methods of the present disclosure is shown in FIG. 1. The term "microreactor" refers to small reactors 112 (FIG. 5) that form upon injection of reactants into system 10, as will be described in greater detail below. Microreactor system 10 comprises a reservoir 12 for holding a carrier liquid and a reactor conduit 14 in fluid communication with the reservoir 12. An injector 16 is in fluid communication with a reactant supply 18. The injector 16 is positioned so as to inject a fluid comprising reactants from the reactant supply 18 into the reactor conduit 14. A temperature control system 17 can optionally be positioned proximate the injector 16 for actively heating or cooling the injectors, as desired. A heating system 19 and a cooling system 15 can optionally be positioned to supply heat to the reactor conduit 14 for controlling the temperature of the microreactors as desired for chemical vapor deposition to form a desired product. A product separation system 20 can comprise a holding tank 22 for holding carrier fluid and product is in fluid communication with the reactor conduit 14. As the product is separated from the carrier fluid by product separation system 20, the product can be collected into a collection vessel 24. The carrier liquid can be returned to reservoir 12 using a carrier liquid return system 30, which may include a pump 32 and conduit 34. FIG. 2 illustrates an exemplary implementation of the microreactor system 10. Similarly as described above for the system of FIG. 1, the microreactor system 10 of FIG. 2 comprises a reservoir 12 for holding a carrier liquid and a reactor conduit 14 in fluid communication with the reservoir 12. An injector 16 is in fluid communication with reactant supply 18. The injector 16 is positioned so as to inject a fluid comprising reactants from the reactant supply 18 into the reactor conduit 14. Optional temperature control system 17 is positioned proximate the injector 16 for actively heating or cooling the injectors, as desired. The heating system 19 is positioned to supply heat to a first segment $14_{s1}$ of the reactor conduit 14. Heat can be applied to all or a portion of first segment $14_{s1}$. The first segment $14_{s1}$ of the reactor conduit 14 can optionally include a drop of a vertical distance, $H_1$ (referred to as "vertical drop" herein). Any suitable vertical drop can be employed, such as a vertical drop ranging from about 10 feet to about 400 feet. The reactor conduit 14 can also include a second segment $14_{s2}$ that does not include a heating system positioned to supply heat thereto or optionally includes a heat harvesting or cooling system 15 positioned to remove heat from the carrier liquid. The optional cooling system 15 can be positioned along a portion of the length or the entire length of the second segment $14_{s2}$. In an example, the second segment $14_{s2}$ can including a rise of a vertical distance, $H_2$ (termed "vertical rise" herein), such as a rise ranging from about 6 feet to about 396 feet. Thus, the term "vertical drop" is defined herein to mean the vertical distance the reactor conduit drops over the first segment, and is not intended to limit the particular configuration of the reactor conduit 14 that is used to achieve the vertical drop. Similarly, the term "vertical rise" is defined herein to mean the vertical distance the reactor conduit rises over the first segment, and is not intended to limit the particular configuration of the reactor conduit 14 that is used to achieve the vertical rise. Thus, the desired vertical drop or vertical rise can be achieved using any configuration of reactor conduit 14 comprising one or more angled segments that may or may not be vertical. A hydrostatic pressure (force per unit area) at any point in reactor conduit 14 can be determined by multiplying the density of the carrier liquid by gravity by the height of the column of fluid above that point in the reactor. In cases such as the microreactor system 10 of FIG. 2, where there are effectively two columns of fluid, the first coming from reservoir 12 to the growth zone $14_G$ and the second going from growth zone $14_G$ to the exit location $14_E$, the shorter of the two fluid column heights would be used as the "height of the column of fluid" for determining the hydrostatic pressure, as would be understood by one of ordinary skill in the art. One of ordinary skill in the art would readily be able to determine hydrostatic pressures within the reactor conduit.

A growth zone $14_G$ within the reactor can produce temperature and pressure conditions suitable for CVD film growth. The growth zone $14_G$ can be positioned between the first segment $14_{s1}$ and the second segment $14_{s2}$. The growth zone $14_G$ may optionally include heating elements for heating the reactor conduit 14, depending on the object being grown. For example, heating system 19 can potentially extend into growth zone $14_G$.

The reactor conduit 14 can have any suitable length that will result in a reaction time to achieve a desired chemical vapor deposition growth for a particular flow rate of carrier liquid through the reactor conduit 14. The length can vary depending on a number of factors, such as flow rate of the carrier liquid, growth rate of the product being formed, and the desired thickness of the deposited film being formed. As an example, the length of the reactor conduit can range from about 10 feet to about 1 mile or more, such as 50 feet to about 2000 feet, or about 100 feet to about 1000 feet.

A hydrostatic pressure difference, which can potentially be augmented by a pump (not shown) drives flow of the carrier liquid down the first segment $14_{s1}$, across the growth zone $14_G$, back up the second segment $14_{s2}$, and optionally back down the reactor conduit 14, to an exit location $14_E$ where the carrier liquid exits the reactor conduit 14 and flows into a product separation system 20. The pressure difference that drives the flow can be due to a difference in the height of the carrier liquid level in reservoir 12 as compared with the relatively lower position of exit location $14_E$.

Figure 3:
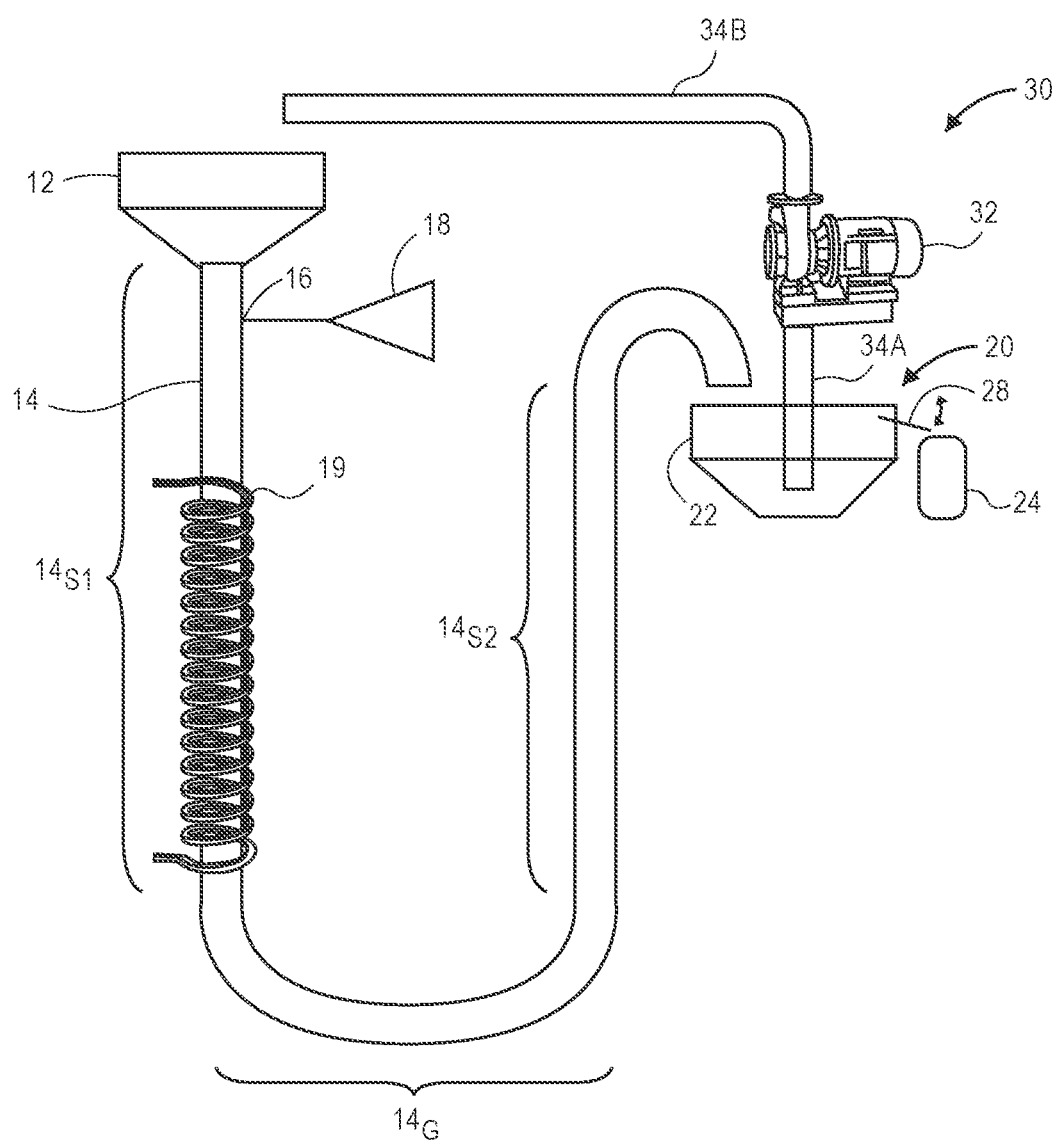
FIG. 3 illustrates a schematic view of an example microreactor system for chemical vapor deposition, according to an aspect of the present disclosure.

The product separation system 20 is in fluid communication with the reactor conduit 14. Product separation system 20 can be any suitable system that is configured to collect a product from the carrier liquid. As an example, product separation system 20 can include a holding tank 22 in fluid communication with the reactor conduit 14 and a product collection vessel 24. A valve 26 is positioned to allow product that settles to the bottom of holding tank 22 to flow in to the product collection vessel 24 when the valve 26 is in an open position. In addition, product separation system 20 includes a mechanism that fluidly connects holding tank 22 with return reservoir 36, such as spillway 28, through which the carrier liquid can flow from holding tank 22 to return reservoir 36. FIG. 3 illustrates an alternative product separation system 20 designed for collecting product that floats. In the design of FIG. 3, product floating at the surface of the liquid carrier in holding tank 22 is allowed to periodically or continuously flow into collection vessel 24 via any suitable mechanism, such as a spillway 28.

As mentioned above, a carrier liquid return system 30 is in fluid communication with the separation system 20 and is also in fluid communication with the reservoir 12, so as to be configured for returning the carrier liquid from the separation system 20 to the reservoir 12. As an example, the carrier liquid return system 30 comprises a pump 32 and one or more return conduits 34A,34B. A return reservoir 36 is positioned to accept liquid carrier from the separation system 20. The pump 32 and one or more return conduits 34A,34B are configured to pump the liquid carrier from the return reservoir 36 to the reservoir 12. Alternatively, if the product being collected floats, the pump 32 and one or more return conduits 34A,34B can be configured to pump the liquid carrier directly from proximate the bottom of the holding tank 22 to the reservoir 12. Various other designs could be employed for the separation system 20 and/or the carrier liquid return system 30.

In FIGS. 2 and 3, the fluid connections between exit location $14_E$ and holding tank 22, as well as between conduit 34B and reservoir 12, are illustrated as being open to the environment. Alternatively, the connections from exit location $14_E$ to holding tank 22 and from conduit 34B to reservoir 12 can be closed to the environment. One of ordinary skill in the art would readily be able to modify the design of microreactor system 10 to provide connections that are closed to the environment.

The present disclosure is also directed to a method of employing microreactors 112, which form in microreactor system 10, for chemical vapor deposition ("CVD"). As shown at 100 of the flow diagram of FIG. 4, the method comprises flowing a carrier liquid through a reactor. Any reactor that is suitable for carrying out CVD using microreactors as set forth herein, can be employed. As an example, any of the reactors of the present disclosure can be used.

Any suitable carrier liquid can be employed that can remain a liquid throughout the process. Because chemical vapor deposition often occurs at relatively high temperatures, this may involve substances that remain liquid at temperatures ranging from, for example, about 300° C. to about 1000° C. or more, at the hydrostatic pressures employed (e.g., about 1 atmosphere to about 10 atmospheres). As an example, the carrier liquid comprises one or more compounds chosen from molten salts, alkanes and mixtures thereof. Some examples of molten salts include 1-Ethyl-3-methylimidazolium-bis(trifluoromethane sulfonyl)amide (also referred to as [$C_2$mim][$Tf_2$N]), NaF—BeF2, LiF—BeF2, LiF—NaF—BeF2, LiF—ZrF4, NaF—ZrF4, KF—ZrF4, Rb—ZrF4, LiF—NaF—ZrF4, LiF—NaF—KF and LiF—NaF—RbF. The alkanes can include, for example, alkanes having about 15 to about 80 carbon atoms, such as about 20 to about 70 carbon atoms. A single alkane or mixtures of two or more of such alkanes can be used. Examples of such alkanes include hexacontane, pentacontane, tetracontane, triacontane, icosane and mixtures thereof.

The particular salt or alkane used can depend on the difference between the temperature of the liquid carrier at the point of injecting the fluid comprising the one or more reactants and the temperature at which CVD growth occurs. If the injection temperature is much lower than the growth temperature, a taller first segment $14_{s1}$ may be employed to provide more pressure in the growth zone $14_G$. High pressure pushes boiling points up, enabling certain liquids to be used beyond their (ambient pressure) boiling points, thus potentially allowing for a wider selection of suitable carrier liquids.

Figure 4:
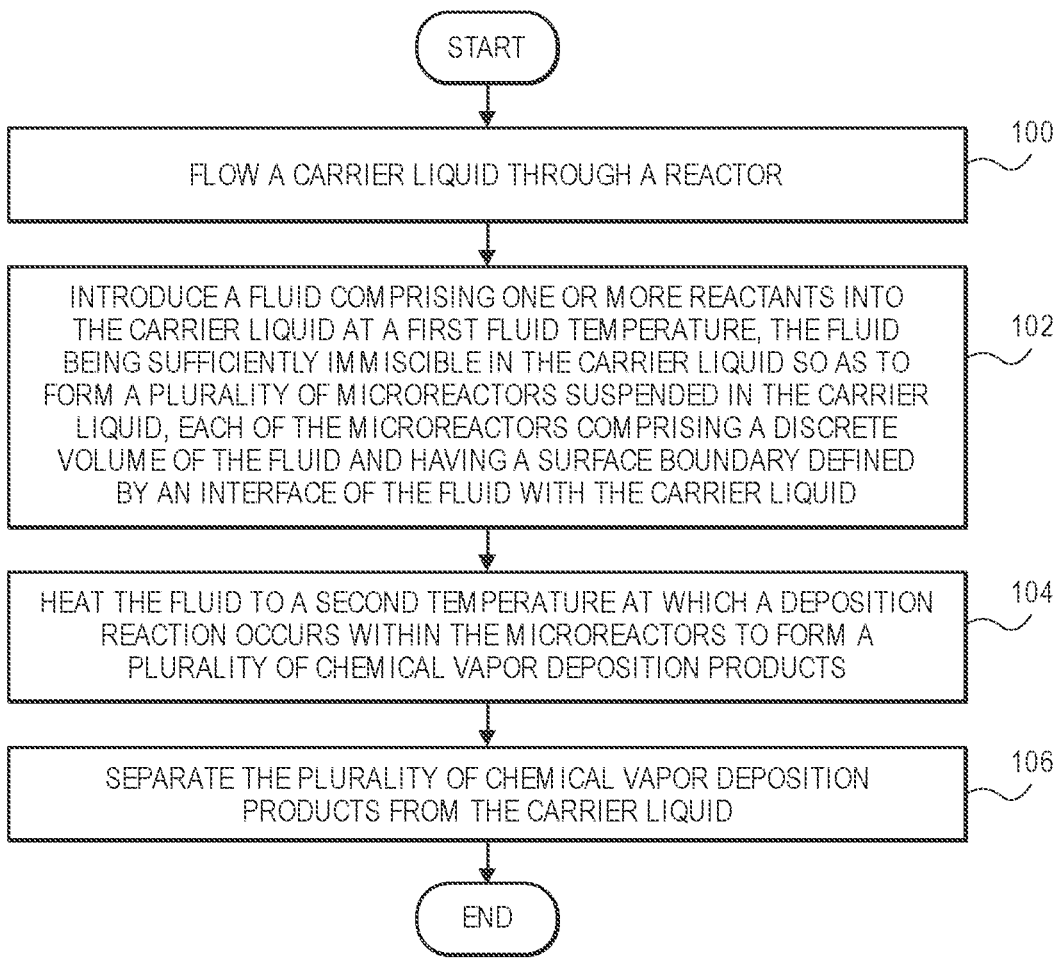
FIG. 4 shows a flow diagram of a process of the present disclosure.

Referring to 102 of the method of FIG. 4, a fluid comprising one or more reactants is introduced into the carrier liquid at a first fluid temperature. The fluid can be introduced using injector 16, which can optionally be actively heated or cooled using a temperature control system 17, so as to allow the temperature of the reactants to a controlled to a desired injection temperature. The injection temperature of the reactants can be cooler, hotter or the same as the temperature of the liquid carrier at the point of injection into reactor conduit 14.

Figure 5:
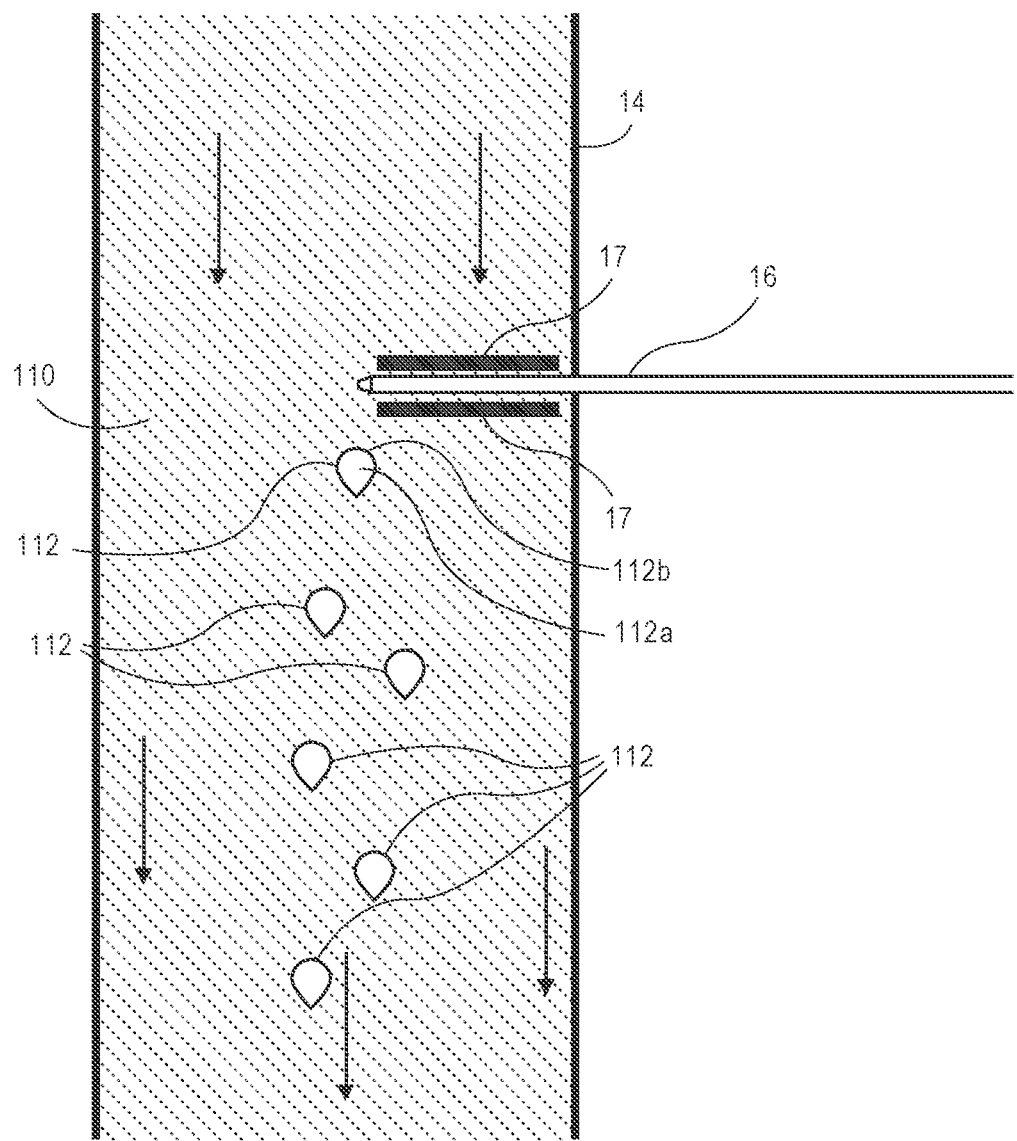
FIG. 5 illustrates examples of microreactors that are suspended in a carrier liquid, according to an aspect of the present disclosure.

Referring to FIG. 5, the injected fluid is sufficiently immiscible in the carrier liquid (shown as 110 in FIG. 5) so as to form a plurality of microreactors 112 that are suspended in the carrier liquid 110. The microreactors 112 can be in the form of gas bubbles or liquid-in-liquid drops. Each of the microreactors 112 comprise a discrete volume of the injected fluid 112a comprising the one or more reactants suitable for chemical vapor deposition. Further, microreactors 112 have a surface boundary 112b that is defined by an interface of the fluid 112a with the carrier liquid 110.

Prior to injecting the fluid 112a, the process can include mixing the constituent reactants to be employed for CVD growth, thereby forming a chemical mixture. Fluid 112a can comprise any known or later developed reactants that are suitable for chemical vapor deposition. Examples of suitable reactants include compounds chosen from hydrocarbons such as alkenes having 2 to 8 carbon atoms (e.g., ethene or propene), silane, $O_2$, $AlCl_3$, $WF_6$, Copper(II) bis(hexafluoroacetylacetonate), $(CH_3)_3Al$, $Fe(CO)_5$, $[(CH_3)_2N]_4Hf$, $W(CO)_6$, $C_5H_4CH_3Pt(CH_3)_3$, and combinations thereof. In addition, the fluid 112a can optionally comprise other components, such as inert gases, for example nitrogen or argon, or solvents or other reactant carrier liquids or gases.

In addition to those reactants specifically listed herein, any other reactants that are suitable for CVD of any desired film or other product can be employed as a reactant in the processes of the present disclosure. Examples of films that can be produced in the microreactors 112 include: silica, aluminum, alumina, tungsten, molybdenum, titanium, silicon nitride, polycrystalline silicon, quartz, diamond, and mercury cadmium telluride. Different temperature conditions can be employed depending on the material being deposited and/or the particular precursor gases employed, although most reactions are believed to be largely independent of pressure. Any suitable known or later developed CVD process chemistries for making such products can be employed in the reactors of the present disclosure. Examples of known processes that can be employed include: 1) Alumina films deposited in an oxidation reaction from $AlCl_3$, $H_2$, and $CO_2$, at 1000° C. and 0.05 atm; and 2) Aluminum films deposited in a pyrolysis reaction from triisobutylaluminum at 220-300° C., independent of pressure. Pressures and temperatures of these and other known CVD chemistries can be modified to provide workable or optimum conditions for the processes of the present disclosure.

Figure 6:
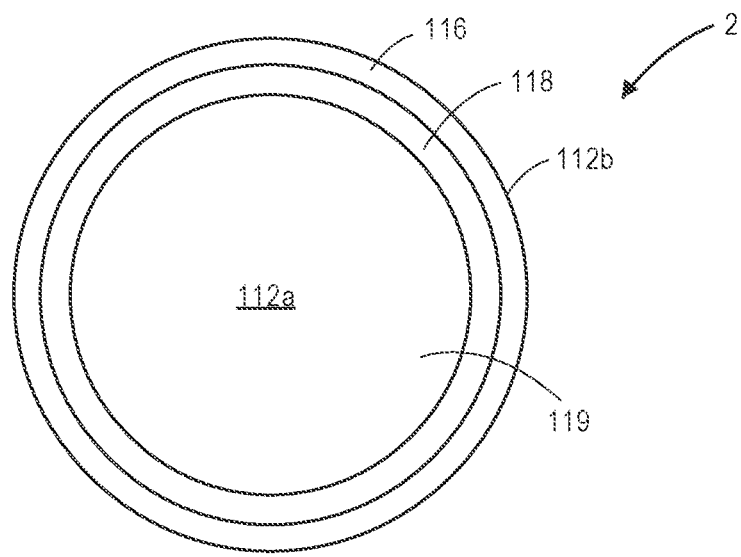
FIG. 6 illustrates a hollow sphere being formed by a deposition reaction at the surface boundary of a microreactor, according to a process of the present disclosure.

The reactant mixture can include reactants for forming only a single type of CVD film or product. Alternatively, two or more types of CVD films can be formed in the microreactors 112 in the form of a layered product. As an example, the one or more reactants can comprise a first reactant for forming a first CVD film and a second reactant for forming a second CVD film that is different than the first CVD film. During the process, the first and second reactants are injected together to form the microreactors 112. Referring to FIG. 6, the first reactant reacts at a second temperature, which is higher than the first temperature at which the fluid reactants are introduced into the system, to form an outer layer 116 at the surface boundary 112b. Then the temperature is increased to a third temperature that is higher than the second temperature. The second reactant reacts at the third temperature to deposit an inner layer 118 on an inner surface of the outer layer 116, thereby forming a shell comprising two layers. For example, an outer layer 116 (FIG. 6) can be formed of silica and an inner layer 118 can comprise a metal, such as aluminum. A hollow interior region 119 is encompassed by outer layer 116 and inner layer 118.

Additional reactants can be included in the fluid 112a to react at still higher temperatures (e.g., a fourth temperature that is higher than the third temperature) to form additional shell layers. Shells comprising any number of desired layers, such as 1 to 10 layers, or 2 to 4 layers, can be produced using this technique. Layered products other than shells can also be formed, such as coated carbon nanotubes.

The one or more fluid reactants can be either a liquid or a gas when they are introduced into reactor conduit 14, as long as the liquid reactants change to the gas phase upon heating to the CVD growth temperatures. In an example, the fluid 112a is predominately a gas at a first temperature, which is the temperature at which the fluid is introduced into the liquid carrier. In another example, the fluid 112a is predominately a liquid at the first temperature and predominately a gas at the second temperature, which is the temperature at which chemical vapor deposition occurs for depositing the desired product. As used herein the term "predominately" is defined to mean more than 50% by weight relative to the total weight of the fluid comprising the one or more reactants, such as 80% or more, 90% or more or 100% by weight.

The constant flow of fluid 112a into the downward-flowing carrier liquid 110 results in the microreactors 112 attempting to rise against the flow of the carrier liquid. To compensate for this effect, the carrier fluid can optionally be chosen to be sufficiently viscous to create enough drag on the microreactors 112 so that they do not rise significantly compared to the downward flow of the carrier liquid.

The size of the microreactors 112 can be varied depending on the process conditions employed. Techniques for increasing or decreasing the bubble size are known to one of ordinary skill in the art and include: decreasing the nozzle size, increasing the fluid flow rate, increasing the fluid viscosity (decreasing the Reynolds number and increasing the drag coefficient), or decreasing the surface tension such as by increasing the temperature. Decreasing the nozzle diameter, such as by going to a porous media nozzle, will also decrease the bubble size. Alternatively, increasing the gas flow rate such that the bubbles can detach due to gas momentum will decrease the bubble volume. The physics and mathematics governing bubble size and formation are generally well known, as described for example in Bai, H., Thomas, B. *Bubble Formation during Horizontal Gas Injection into Downward-Flowing Liquid*. Metallurgical and Materials Transactions B, December 2001, Volume 32, Issue 6, pp 1143-1159.

As carrier liquid 110 and the plurality of microreactors 112 flow through reactor conduit 14, the fluid 112a is heated to a second temperature at which a deposition reaction occurs within the microreactors 112 to form a plurality of chemical vapor deposition products. Various types of products can be formed. By controlling the temperature and pressure of the flowing carrier liquid 110, and thereby of the microreactors 112, the CVD growth can be sustained for a period of time within the reactor conduit 14 so as to form the desired products. The specific temperatures and pressures employed will depend on the particular products being formed.

As the carrier liquid 110 and the fluid 112a are heated by heating system 19, the gas in the microreactors 112 expands, which acts to increase the volume of the microreactors. However, because the microreactors 112 are going down as the temperature is increased, the hydrostatic pressure on the gas in the microreactors 112 also increases, which can act to decrease the volume of the microreactors. Thus, using the configuration of the reactor of FIG. 2 having a first segment $14_{s1}$ with a vertical drop designed to achieve a desired hydrostatic pressure, it is possible to balance the volume increase associated with increasing temperature and the volume decrease associated with increasing hydrostatic pressure at the surface boundary 112b so as to provide for a substantially constant microreactor volume. Similarly, as the carrier liquid and microreactors 112 are allowed to cool while the carrier liquid 110 and microreactors 112 are flowing up the second segment $14_{s2}$, it is also possible to balance the decrease in temperature of the gas in the microreactors 112 with the decrease in hydrostatic pressure at the surface boundary 112b to again maintain a substantially constant volume in the second segment $14_{s2}$. The phrase "substantially constant" in this context means that the microreactor volume is sufficiently constant to allow a hollow sphere to form by chemical vapor deposition at the surface boundary 112b without fracturing.

Maintaining a constant volume can have advantages when forming shells at the microreactor interface, as will be discussed in more detail below. Balancing the pressure and temperature to maintain a substantially constant volume is optional. In some cases it may be desirable or acceptable to increase or decrease the volume of the microreactors, or the pressure drop across the surface of the microreactors, such as may be the case when forming carbon nanotubes, as will be described in more detail below.

The CVD growth process can be completed by cooling the plurality of chemical vapor deposition products to a temperature that is sufficiently low so that chemical vapor deposition terminates. Such cooling can occur within the second segment $14_{s2}$, the holding tank 22 and/or the collection vessel 24. Alternatively, the CVD growth process can be completed when one of the reactants is entirely reacted and thus depleted from the microreactor. Such starvation can occur, for example, within the growth zone $14_G$.

After completion of the CVD growth process the microreactors 112 can optionally be allowed to rise to a surface of the carrier liquid 110 in holding tank 22. In some instances the microreactors fracture, or pop, at the carrier liquid surface, thereby releasing waste fluid and/or freeing products (e.g., nanotubes) from the microreactors. The waste fluid can comprise a substance chosen from gas byproducts, liquid byproducts, unreacted reactant gas, unreacted liquid and a combination thereof. The waste fluid can be collected for disposal or reuse, such as for reuse in the processes of the present disclosure. In alternative processes, such as where hollow spheres are formed, the shells of the microreactors may themselves be the products. In such cases, any fluid in the hollow spheres may optionally remain in the spheres as part of the product.

The products formed by the CVD process can be separated from the carrier liquid 110 by any desired technique. For example, a separation system 20 as shown in either of FIG. 1 or 2 can be employed. As illustrated in FIG. 2, a valve 26 can be opened periodically to allow settled product that sinks, such as CNT in a relatively less dense liquid carrier, to be collected in interchangeable collection vessels 24. Alternatively, floating product, such as hollow spheres, may be skimmed off a top surface of the carrier liquid, such as by using the configuration as shown in FIG. 3.

The carrier liquid can overflow from holding tank 22 into return reservoir 36 via any suitable mechanism, such as a spillway 28. From return reservoir 36, the carrier liquid can be returned to the reactor for reuse, such as by introducing carrier liquid 110 back into reservoir 12 using carrier liquid return system 30. The process can include filtering, cooling or heating, and recirculating the carrier liquid to sustain a continuous production process.

The processes of the present disclosure can be employed to form a variety of products. Exemplary products comprise one or more shell layers formed by CVD that surround a hollow (e.g., gas filled) center, such as hollow spheres or other hollow shapes having a substantially circular or teardrop shaped cross section. A schematic view of a cross section of a hollow sphere is shown in FIG. 6. The actual shape of the hollow products may be determined by the ratios of the buoyant force and drag to the surface energy. Smaller microreactors are more likely to be spheres or substantially spherical shapes, while larger reactors may take on slight tear shapes. What constitutes small or large depends on the carrier liquid and reactant fluid being used. That said, for many or all carrier liquids and reactant fluids disclosed herein, product sizes that are, for example, a few millimeters in diameter or smaller are likely to be indistinguishable from a sphere using the human eye alone. For catalyst-based CNT production, as discussed herein, there is a strong likelihood that the catalyst particle on the surface will change the surface energy locally such that a tear-like shape may be made due to differences in surface energy at the surface boundary in contact with the catalyst versus away from the catalyst, rather than merely due to the buoyant force or drag.

Referring to FIG. 6, when forming the hollow shelled products of the present disclosure, the deposition reaction comprises reacting the one or more reactants at the surface boundary 112b of the microreactor to form an outer layer 116. Thus, the liquid-vapor interface that forms surface boundary 112b is employed as the growth substrate. If desired, one or more optional additional inner layers 118 can be formed on the outer layer using processing conditions suitable for forming multiple layers, as described above.

Any suitable temperature and pressure conditions that result in growth of the desired shell product at the surface boundary 112b can be employed. Suitable temperature and pressure conditions for CVD growth can be achieved by heating the carrier liquid 110 and increasing hydrostatic pressure in the first segment $14_{s1}$ of the reactor conduit 14. The desired CVD growth for the shell layer or outer layer 116 can then be maintained within the microreactors 112 flowing through growth zone $14_G$. It may be advantageous to allow the carrier liquid 110 to cool in the growth zone $14_G$. Such cooling of the carrier liquid can in turn cool the surface boundaries 112b of the microreactors below the CVD growth temperature, while the reactant gas in the microreactors 112 remains at the growth temperature so as to cause film nucleation and growth at the surface boundary.

Providing for uniformity of dimensions across the plurality of spherical shells produced, including a substantially similar shell thickness and/or sphere diameter for each shell produced, can be achieved to the degree the same growth conditions are maintained for each of the microreactors 112. Because the process can allow for good growth condition uniformity, including substantially the same microreactor volume, growth temperature and time of reaction for all or a large majority of the microreactors 112, the process can allow a high degree of shell product uniformity to be achieved.

In an example, it is desirable to maintain the discrete volume of the microreactors 112 to be sufficiently constant during the deposition reaction so as to avoid fracturing of the shell (e.g., outer layer 116 and optional inner layers 118) by balancing the temperature and pressure of the gas in the microreactors 112. One method of maintaining a volume that is sufficiently constant comprises at least one of: 1) increasing a hydrostatic pressure at the surface boundary 112b of the microreactors 112 while heating the fluid and 2) decreasing the hydrostatic pressure while cooling the fluid. In an alternative example, the discrete volume of the fluid 112a can be changed during the deposition reaction sufficiently so as to fracture the microreactors.

The hollow shelled products (e.g., spheres) produced by the processes of the present disclosure can have shells comprising any material that can be deposited by CVD techniques, including any of the materials described herein. Examples of such products can include hollow shelled products (e.g., spheres) with shells comprising glass (e.g., silicas), metal nitrides, metal oxides such as alumina, silicon nitrides, carbon such as graphite, metal such as aluminum, refractory metals, and many other materials. The hollow shelled products (e.g., spheres) can have any suitable diameter, such as about 1 micron to about 10 cm or larger, or about 100 microns to about 1 cm, or about 1 mm to about 1 cm.

The size of the hollow shelled products can be controlled by controlling the microreactor diameter, while the thickness of the shells can be controlled by controlling growth rate and growth time, as described herein. Thus, the processes of the present disclosure enable mass production of hollow shelled products of controlled size, thickness, and composition. Such hollow shelled products (with customized size, thickness, composition, coatings) may be used for many purposes such as hydrogen storage, fill material in composite materials, and meta-materials at the microwave scale.

The process of the present disclosure can also be employed for manufacturing carbon nanotubes ("CNTs"). Manufacturing CNTs in the microreactors 112 includes introducing a solid catalyst, generally in the form of a plurality of particles, into the reactor conduit 14. The solid catalyst particles can be introduced in any suitable manner, including introduction directly into the carrier liquid 110 or by mixing with the reactants followed by introduction through injector 16.

Any suitable solid catalyst for use in chemical vapor deposition of carbon nanotubes can potentially be employed. For example, a solid catalyst in the form of a nanoparticle can be used for growing a carbon nanotube ("CNT"). The solid catalyst can include nanoparticles comprising, for example, a transition metal such as Group VIB chromium (Cr), molybdenum (Mo), tungsten (W) or Group VIIIB transition metals, e. g., iron (Fe), cobalt (Co), nickel (Ni), ruthenium (Ru), rhodium (Rh), palladium (Pd), osmium (Os), iridium (Ir) and platinum (Pt) or mixtures thereof.

Figure 7:
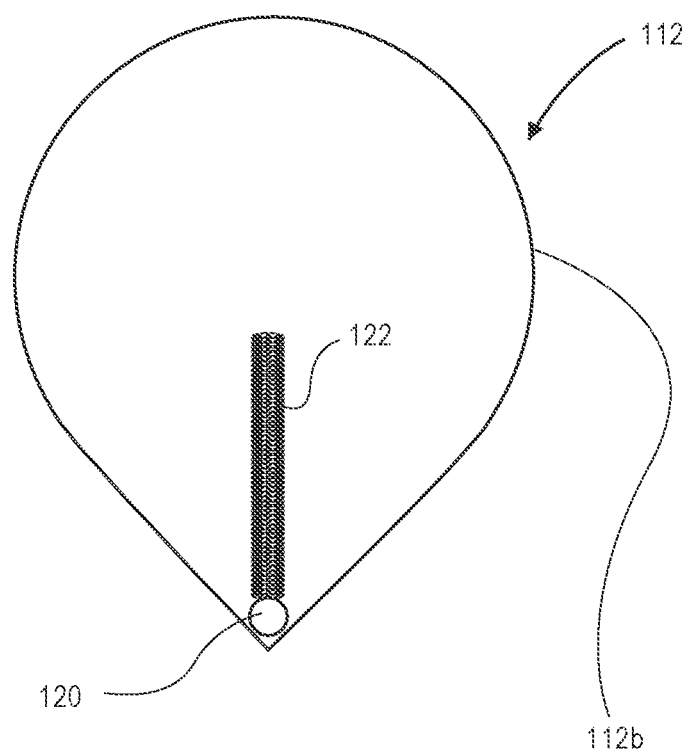
FIG. 7 illustrates a carbon nanotube being formed by a deposition reaction in a microreactor, according to a process of the present disclosure.

Referring to FIG. 7, a portion of the solid catalyst 120 that is introduced into reactor conduit 14 comes into contact with the microreactors 112. Due to surface energy effects at the surface boundary 112b, the solid catalyst 120 attaches to the surface boundary 112b of the microreactors 112.

The reactor conduit 14 is heated using heating system 19 to heat the carrier liquid 110 and the microreactors 112 to a suitable growth temperature as the hydrostatic pressure rises due to the vertical drop associated with the flow of liquid carrier down first segment $14_{s1}$. Suitable temperatures and pressures for CVD growth of the CNTs 122 are achieved prior to or not long after the microreactors 112 enter growth zone $14_G$. The CVD growth conditions are then maintained in the growth zone $14_G$ for a suitable time period. For growing CNTs 122, this can include continued heating of the carrier fluid so that both the carrier fluid and the microreactors 112 remain at the "growth" temperature for a period sufficient to grow the CNT to a desired length. Optionally, the temperature and hydrostatic pressure can be controlled to provide for a substantially constant volume of the microreactors 112 during growth of the CNT 122, similarly as was discussed above for the formation of the hollow shelled products. Maintaining a substantially constant volume may reduce the likelihood that the microreactors converge relative to a case where the volumes of the microreactors were allowed to increase significantly.

The uniformity of the CNTs 122 can be achieved to the degree the same growth conditions are maintained for each of the microreactors 112. Because the process can allow very good growth condition uniformity, including substantially the same microreactor volume, amount and size of catalyst, growth temperature and reaction time for all or a large majority of the microreactors, the process can allow a high degree of uniformity of the CNTs to be achieved. For example, the carbon nanotubes ("CNTs") may exhibit a relatively uniform length distribution among CNT of a given chirality. Thus, by actively controlling the amount of growth catalyst and size of each microreactor 112, the methods of the present disclosure promote uniform CNT/thin film growth in a continuous manufacturing process.

EXAMPLES

Example 1

Carbon Nanotubes

Example chemistry for CNT growth can include employing the following reactants, carrier liquid and conditions in the process and systems of the present disclosure.

Reactant CVD feedstock: $C_2H_2$ gas
Catalyst: iron nanoparticles
Growth Temperature: 700° C.
Carrier liquid: NaF—$BeF_2$ (molten salt)
Injection Temperature: 400° C.

Example 2

Thin Film Growth for Forming Hollow Alumina Spheres

Example chemistry for forming hollow spheres using methods and reactor system of the present disclosure are as follows:

Feedstock: $AlCl_3$, $H_2$, and $CO_2$ gases
Catalyst: none
Growth Temperature: 800° C.
Carrier fluid: NaF—$BeF_2$ (molten salt)
Injection Temperature: 500° C.

Example 3

Thin Film Growth for Forming Hollow Silica Spheres

Example chemistry for forming hollow spheres using methods and reactor system of the present disclosure are as follows:

Feedstock: Silane and $O_2$ gases
Catalyst: none
Growth Temperature: 450° C.
Carrier fluid: NaF—$BeF_2$ (molten salt)
Injection Temperature: 360° C.

The chemistry of Example 3 for forming silica shells can involve an oxidation reaction in which Silane and $O_2$ react at 450° C. to produce a $SiO_2$ film at the microreactor surface boundary with controlled thickness. This specific reaction is pressure-independent. The details of the example process for forming hollow silica spheres are as follows.

The silane and oxygen feedstock gas mixture is injected into a suitable ionic fluid in the reactor conduit 14. Any ionic liquids that are liquid both at room temperature (or other injection temperature) and at the about 450° C. growth temperature can be used. One example of such as an ionic fluid is [$C_2$mim][$Tf_2$N]: 1-Ethyl-3-methylimidazolium bis (trifluoromethane sulfonyl)amide, which has a temperature onset for decomposition of about 455° C. and a melting point of about 4° C. Because the reaction occurs at 450° C. independent of pressure, any hydrostatic pressure that provides a suitable pressure increase for balancing temperature and pressure conditions for maintaining a relatively constant microreactor volume can be employed.

For example 3, the volume of each bubble was calculated to be about 33.5 cc. This assumes applying an inlet gas mixture at 2000 standard cubic centimeters per minute (sccm) resulting in the formation of 60 bubbles per minute, or 1 per second. If the parameters were changed such that the bubbles had a 200 micron radius, 20 sccm of flow would produce $10^4$ bubbles per second.

To maintain a substantially constant volume as the temperature is increased from room temperature (e.g., 20 C) to about 450 C, the pressure can be increased by about 146%, from the about 14.7 psi atmospheric pressure to about 36.3 psi. Using hydrostatic pressure, this could be accomplished given the density of 2.0 g/cc for the ionic fluid using about a 24 ft column of the fluid.

The expected rate of growth of the shell is about 0.3 microns/seconds at these conditions. To make an exemplary 20 micron thick shell, about a 60 second residence time can be employed. If the fluid pipe cross-section remains constant and the flow rate is 3 m/s, this could be accomplished using a 180 m reaction zone. This length can easily be achieved by using a simple back and forth path for the growth zone of the reactor conduit, as is found in a typical heat exchanger, for example. Multiple layers can be used to further reduce the footprint without significantly impacting the hydrostatic pressure.

Example 4

Multilayered Sphere

The production of hollow glass spheres comprising metal films coating the inside of a silica shell can be made by including a second precursor gas (for the metal film) that decomposes at temperatures higher than the reaction that makes the glass shell in the process as described in Example 3. Depending on the metal to be deposited, this may include using a modified growth temperature for the glass. For example, silica glass can be deposited at a slow rate at 300° C., for instance. This would allow the temperature to be increased after the glass outer shell is formed to, for example, a metal CVD growth temperature of about 392° C. (with an optional hydrostatic pressure increase to preserve volume) to precipitate aluminum from $Al_2(N(CH_3)_2)_6$, so as to coat the inner surface of the silica glass shell. Any other suitable metal, including any metals described herein, could be deposited instead of the aluminum in this example.

Example 5

Doped Silica Sphere with Metal Coating

The production of hollow, doped glass spheres with metal films coating an outer silica shell layer can be made by including a second precursor gas (for the metal) that decomposes at temperatures higher than the reaction that makes the glass shell. Such a process can be performed by replacing the alumina precursor gas with $WF_6$ (gas) in the feedstock of Example 4. After producing the glass sphere at about 300° C., the temperature can be increased to above 400° C. so as to result in a reaction of some of the silica to $SiF_n$ and the further deposition of tungsten on the inner surface of the doped silica.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A chemical vapor deposition ("CVD") microreactor system for forming a CVD product, the CVD microreactor system comprising:
   a reservoir for holding a carrier liquid;
   a continuous reactor conduit comprising a first end, a first segment, a second segment and a second end, the first end being in fluid communication with the reservoir, the first segment of the reactor conduit being positioned between the first end and the second segment and including a vertical drop ranging from about 10 feet to about 400 feet, the second segment being positioned between the first segment and the second end and including a vertical rise ranging from about 6 feet to about 396 feet, the reactor conduit being a single, continuous length of conduit and having a substantially constant width throughout its length so as to allow for continuous flow of both the carrier liquid and a CVD product from the second end of the reactor conduit during operation of the CVD microreactor system;
   an injector in fluid communication with a reactant supply, the injector positioned so as to inject a fluid comprising reactants for forming the CVD product from the reactant supply directly into the first segment of the reactor conduit at an injection point below the first end;
   a heater proximate the first segment of the reactor conduit, the heater positioned between the injector and the second segment
   a temperature control system positioned to actively heat or cool the injector;
   a product separation system comprising a holding tank and a collection vessel that is separate from the holding tank, the holding tank being in fluid communication with the second end of the reactor conduit so as to allow the carrier liquid and CVD product to simultaneously and continuously flow into the holding tank from the second end, the holding tank being operably connected to the collection vessel so as to allow the CVD product to flow out of the holding tank and into the collection vessel; and
   a carrier liquid return system in fluid connection with both the holding tank and the reservoir for holding the carrier liquid, the carrier liquid return system comprising a pump and a return conduit configured for returning the carrier liquid from the separation system to the reservoir,
   wherein the CVD microreactor system is a continuous flow reactor.

2. The microreactor system of claim 1, wherein the heater is coiled around the first segment of the reactor conduit.

3. The microreactor system of claim 2, wherein the second segment is unheated.

4. The microreactor system of claim 3, further comprising a cooling system apparatus positioned proximate to, and extending along a length of, the second segment.

5. The microreactor system of claim 3, further comprising a growth zone positioned between the first segment and the second segment.

6. The microreactor system of claim 5, further comprising heating elements for heating the growth zone.

7. The microreactor system of claim 3, wherein the length of the reactor conduit ranges from about 10 feet to about 1 mile.

8. The microreactor system of claim 1, wherein the collection vessel is configured to i) collect product floating at a surface of a liquid carrier in the holding tank or ii) collect product that settles to the bottom of a holding tank.

9. A chemical vapor deposition ("CVD") microreactor system for forming a CVD product, the CVD microreactor system comprising:
   a reservoir for holding a carrier liquid;
   a continuous reactor conduit comprising a first end, a first segment, a second segment and a second end, the first end being in fluid communication with the reservoir, the first segment of the reactor conduit being positioned between the first end and the second segment and including a vertical drop ranging from about 10 feet to about 400 feet, the second segment being positioned between the first segment and the second end and including a vertical rise ranging from about 6 feet to about 396 feet, the reactor conduit being a single, continuous length of conduit and having a substantially constant width throughout its length so as to allow for continuous flow of both the carrier liquid and a CVD product from the second end of the reactor conduit;

an injector in fluid communication with a reactant supply, the injector positioned so as to inject a fluid comprising reactants for forming the CVD product from the reactant supply directly into the first segment of the reactor conduit at an injection point below the first end;

a heater proximate the first segment of the reactor conduit, the heater positioned between the injector and the second segment;

a product separation system comprising a holding tank and a collection vessel that is separate from the holding tank, the holding tank being in fluid communication with the second end of the reactor conduit so as to allow the carrier liquid and CVD product to simultaneously and continuously flow into the holding tank from the second end, the holding tank being operably connected to the collection vessel so as to allow the CVD product to flow out of the holding tank and into the collection vessel; and a carrier liquid return system in fluid communication with both the holding tank and the reservoir for holding the carrier liquid, the carrier liquid return system comprising a pump and a return conduit configured for returning the carrier liquid from the separation system to the reservoir, wherein the CVD microreactor system is a continuous flow reactor.

10. The microreactor system of claim 9, wherein the heater is coiled around the first segment of the reactor conduit.

11. The microreactor system of claim 9, wherein the second segment is unheated.

12. The microreactor system of claim 11, further comprising a cooling system apparatus positioned proximate to, and extending along a length of, the second segment.

13. The microreactor system of claim 11, further comprising a growth zone positioned between the first segment and the second segment.

14. The microreactor system of claim 13, further comprising heating elements for heating the growth zone.

15. The microreactor system of claim 9, wherein the collection vessel is configured to i) collect product floating at a surface of a liquid carrier in the holding tank or ii) collect product that settles to the bottom of a holding tank.

16. The microreactor system of claim 3, wherein the length of the reactor conduit ranges from about 50 feet to about 1 mile.

17. The microreactor system of claim 1, wherein the fluid communication between the second end of the reaction conduit and the holding tank is open to the environment.

18. The microreactor system of claim 1, wherein the fluid communication between the first end of the reaction conduit and the reservoir is open to the environment.

19. The microreactor system of claim 9, wherein the fluid communication between the second end of the reaction conduit and the holding tank is open to the environment.

20. The microreactor system of claim 9, wherein the fluid communication between the first end of the reaction conduit and the reservoir is open to the environment.

* * * * *